(12) United States Patent
Conboy et al.

(10) Patent No.: US 6,392,403 B1
(45) Date of Patent: May 21, 2002

(54) INTEGRATED WAFER STOCKER AND SORTER APPARATUS

(75) Inventors: Michael R. Conboy; Elfido Coss, Jr., both of Austin; Russel Shirley, Pflugerville; Eric Christensen, Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/496,531

(22) Filed: Feb. 2, 2000

(51) Int. Cl.[7] .............................................. G01R 31/28

(52) U.S. Cl. ...................................... 324/158.1; 324/765

(58) Field of Search ............................. 324/158.1, 765, 324/763, 764, 758; 414/416, 442; 209/573; 348/91

(56) References Cited

U.S. PATENT DOCUMENTS 6,147,316 A * 8/2000 Beffa ........................ 324/158.1
6,104,183 A * 11/2000 Kobayashi ............... 324/158.1

* cited by examiner

*Primary Examiner*—Safet Metjahic
*Assistant Examiner*—J Kerveros

(57) ABSTRACT

An apparatus and a system for stocking and sorting wafers in a wafer processing system reduce cycle time in manufacturing and reduce excessive handling of delicate wafers. In an example embodiment, the apparatus includes in an enclosure having therein a scanner adapted to identify codes located on the wafer carriers that indicate the position of a wafer within the carrier. A sorting mechanism for sorting wafers and carriers within the enclosure is also included as well as a computer arrangement that communicates with the management system of the wafer processing system. One of the advantages of the present invention is the reduction in cycle time that is achieved by sorting wafers immediately on demand while at a stocking location.

25 Claims, 4 Drawing Sheets

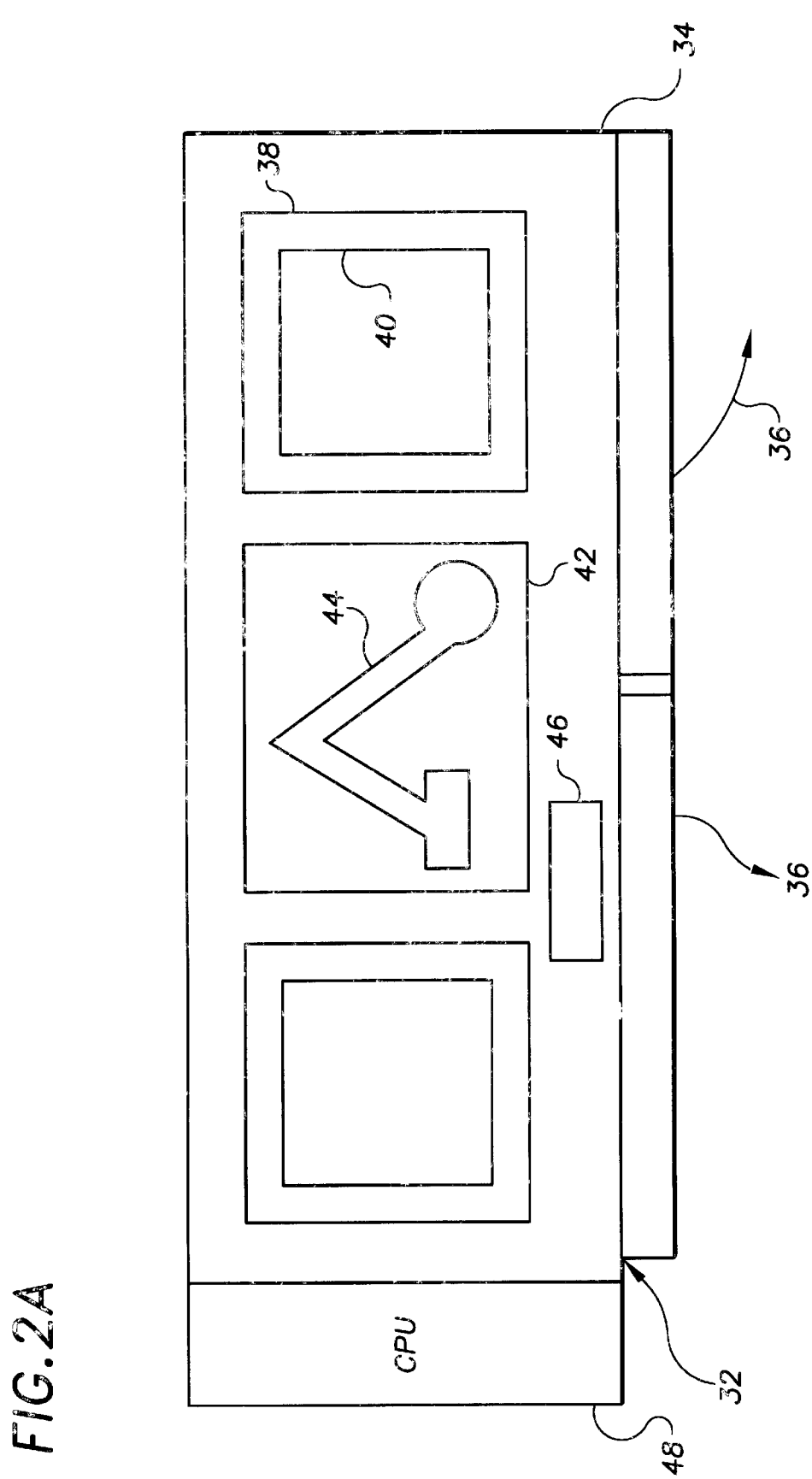

INTEGRATED WAFER STOCKER AND SORTER APPARATUS

FIELD OF THE INVENTION

The present invention generally relates to semiconductor fabrication equipment and, more particularly, to an apparatus and system integrating the wafer stocking and sorting function for use in a semiconductor processing line.

BACKGROUND OF THE INVENTION

A conventional semiconductor fabrication plant typically includes multiple fabrication areas or bays interconnected by a path, such as a conveyor belt. Each bay generally includes the requisite fabrication tools (interconnected by a subpath) to process semiconductor wafers for a particular purpose, such as photolithography, chemical-mechanical polishing, or chemical vapor deposition. Material stockers or stocking tools generally are located about the plant and store semiconductor wafers waiting to be processed. The wafers are typically stored in containers, such as cassettes, each of which can hold up to 25 wafers. The cassettes are then stored in carriers that facilitate movement throughout the plant. The carriers can move material in lots, primarily between stocking locations, such as production wafers, test wafers, or empty cassettes if necessary to ensure that the process is moving smoothly.

A material stocker typically services two or more bays and can hold hundreds of cassettes. While not shown, the semiconductor fabrication plant, including the bays, material stockers and the interconnecting path, typically operates under control of a distributed computer system running a factory management program. Another program can be implemented to track and control the movement of material in the carriers throughout the plant.

A typical semiconductor fabrication plant handles the processing of thousands of wafers at any given time. The wafers are typically divided into lots that undergo different processing sequences. Most of the time the mix of material, in the form of lots, moving through the plant includes test wafers and empty cassettes that are moved frequently into and out of the manufacturing line. A more detailed discussion of the movement of lots throughout a semiconductor manufacturing facility may be found in U.S. Pat. No. 5,751,581 issued May 12, 1998 to Tau et al., entitled "Material Movement Server," which is herein incorporated by reference.

Cycle time is increased when the wafers have to be sorted prior to being introduced in the line and a wafer sorter is not readily available. Profitable short-term opportunities could be pursued if the manufacturing line were more readily responsive to event changes or management directives. In view of the above, there is a need to integrate such event changes or a management level directives into the production schedule without substantially disrupting the flow of material through the plant, lowering the manufacturing yield or increasing cycle time.

SUMMARY OF THE INVENTION

The present invention is directed to addressing the above and other needs in connection with improving efficiencies of wafer stocking and sorting systems.

The present invention is exemplified in a number of implementations and applications, some of which are summarized below. It has been discovered herewith that reduced cycle time can be realized by having the capability of sorting a wafer lot while at a stocking location irrespective of other operations on the processing line, as described in various aspects below. Further, based on the type of wafer lot being processed, the stocker/sorter apparatus can automatically make wafer adjustments with respect to certain recipes or conduct a recovery operation (in case of a loss of power) without having to seek out a separate wafer sorter. Accordingly, a wafer stocking and sorting apparatus that addresses this need of reducing cycle time and reduces the need for excessive handling of delicate wafers that can lead to a reduction in manufacturing yield is described herein.

In one aspect of the invention, the apparatus includes a scanning arrangement that scans wafers and wafer carriers to identify codes located on the wafer carriers that indicate the position of a wafer within the carrier and by slot. A sorting arrangement sorts wafers and carriers within storage bins located in an enclosure. The apparatus also includes a computer arrangement that controls the scanning and sorting arrangements and stores data retrieved therefrom, the data being used for wafer selection and for tracking wafer movement from the start of processing.

According to another aspect of the invention, a system for storing and sorting wafers in a wafer processing system includes a plurality of stocking locations for wafers and cassettes; a plurality of carriers having wafers and cassettes disposed therein; an apparatus for stocking and sorting wafers adapted to track wafer movement from the start of processing and to select wafers as a function of an externally provided directive; and a conveyor arrangement for moving wafers from one of the stocking locations to a processing location.

In yet another aspect of the invention, an apparatus for storing and sorting wafers for use in a wafer processing system includes a scanning device for scanning wafers and wafer carriers. The scanning device identifies codes located on the wafer carriers that indicate the position of a wafer within the carrier and by slot. A robotic arm sorts wafers and carriers within storage bins located in an enclosure. A computer arrangement controls the scanner and the robotic arm and stores data retrieved therefrom, the data being used for wafer selection and for tracking wafer movement from the start of processing.

In yet another aspect of the invention, a method for storing and sorting wafers for use in a wafer processing system includes scanning wafers and wafer carriers by identifying codes located on the wafer carriers that indicate the position of a wafer within the carrier and by slot. The wafers and carriers are sorted within storage bins located in an enclosure and a computer arrangement controlling the scanning and sorting and storing data retrieved therefrom is then used. The data retrieved is used for wafer selection and for tracking wafer movement from the start of processing.

The above summary of the present invention is not intended to describe each illustrated embodiment or every implementation of the present invention. The figures in the detailed description that follow more particularly exemplify these embodiments

BRIEF DESCRIPTION OF THE DRAWINGS

The invention may be more completely understood in consideration of the following detailed description of various embodiments of the invention in connection with the accompanying drawings, in which:

FIG. 2A illustrates a top view of the integrated stocker/sorter apparatus in accordance with an embodiment of the invention;

Figure 1:
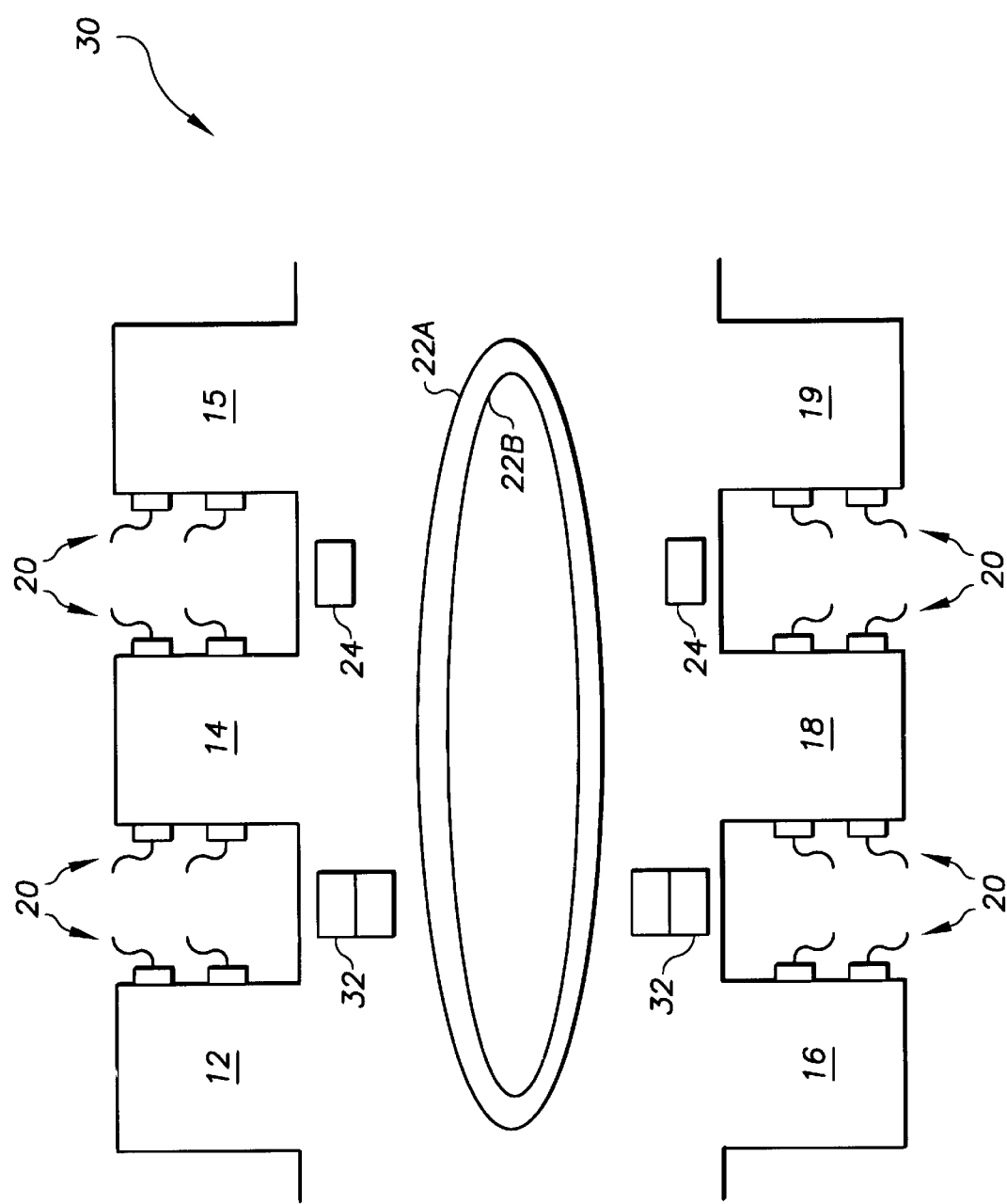
FIG. 1 is a schematic diagram showing the physical layout of a shop floor in accordance with an embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is generally directed to an apparatus for stocking and sorting wafers and cassettes. The invention is particularly suited for reducing the cycle time of processing wafers and reducing the risk of damage to the wafers due to excessive handling. While the present invention is not so limited, a better understanding of the invention will be found by reading the detailed description and exemplary embodiments that follow. Moreover, while the exemplary embodiment relates to a semiconductor facility processing wafers, it should be appreciated that the invention is not so limited.

In an example embodiment, a wafer stocking and sorting apparatus for use in a wafer processing system reduces cycle time and reduces the need for excessive handling of delicate wafers. The apparatus includes a scanning arrangement that scans wafers and wafer carriers to identify codes located on the wafer carriers that indicate the position of a wafer within the carrier and by slot. A sorting arrangement sorts wafers and carriers within storage bins located in an enclosure. The apparatus also includes a computer arrangement that controls the scanning and sorting arrangements and stores data retrieved therefrom, the data being used for wafer selection and for tracking wafer movement from the start of processing.

Referring now to the figures, in FIG. 1 a schematic diagram of the physical layout of a shop floor 30 of a semiconductor fabrication facility includes multiple bays 12, 14, 15, 16, 18 and 19. The bays have various manufacturing tools 20 located about the bays and there is included a set of monorails 22a and 22b that move carriers with material lots, which may include cassettes, to and from various material stockers 24. A single material stocker usually services two bays, as shown, and a few wafer sorters 26a and 26b service several stockers or stocking locations. Wafer sorters are usually moved from one stocker to another depending on the need to sort wafers before the next processing step is to start. If the number of sorters available is less than the number of stockers that need them for sorting, then a bottleneck usually develops in the wafer processing system at one of the stocker locations, thereby increasing cycle time until a wafer sorter becomes available. Despite advanced planning and pre-positioning of wafers and cassettes at certain locations, a last minute change in a wafer recipe may require the sorting/inspection function to be performed at a time when all of the available sorters are being utilized. Therefore, as it will become apparent providing an apparatus having the stocking and sorting functions integrated into one would not only improve manufacturing efficiency but also would improve flexibility in a wafer processing line.

A stocking/sorting apparatus 32 is located near bays 12 and 14 and another is located near bays 16 and 18. Apparatus 32 provides wafer stocking and sorting functionality in a single enclosure and location. Apparatus 32 has a computer arrangement therein that is coupled to the manufacturing facility system and to the overall facility management system. The computer arrangement controls the internal functions of the apparatus and can process instructions from the manufacturing and management systems when changes must be made to the processing of current wafer lots.

Where an error occurs in the stocking operation of apparatus 32 or when its desired by the system manager (spot checks, etc.), the computer arrangement will initiate a mapping check of the wafer carriers contained within apparatus 32, automatically verifying the contents. This includes, but is not limited to, all aspects of wafer count, wafer presence versus cassette identification, wafer slot count per location check, slot locations, single and limited wafer identification, and wafer rotational offset. If an error occurs in the sorter operation, the computer arrangement initiates a de-assemble command such that the wafer movement is returned to the original components and the carrier is moved out for external inspection.

Apparatus 32 also has recipe functionality such that wafers are read and grouped in response to instructions from an internal program or from the manufacturing facility system. Recipe functionality includes externally guided recipes and on-demand internal recipes, this functionality being combinable with other system functions that can include balancing of cassette types, cassette cleaning and empty cassette integration. Apparatus 32 can be programmed to manipulate multiple carrier sets (more that 2) to do large set merge, split, extractions and combinations. Apparatus 32 can also verify the physical dimensional aspects of the carriers and of the production or test wafers and can identify out-of-specification wafer lots and conduct lot compression on test lots or on single wafer lots. The apparatus can be programmed to randomly pull cassettes into the system to check verification accuracy. High level functionality can be incorporated into apparatus 32 by having the management system communicate with both stocking and sorting sub-systems through the computer interface or separately by decoupling the stocker and sorter portions. This allows the sub-systems to be separated for production and maintenance purposes. The management system includes a management input module and a business rules module that helps to integrate management directives into the wafer storing and sorting system. For further details on the management input and business rule modules, reference is made to the concurrently filed U.S. patent application, Ser. No. 09/496,205, entitled "Integration of Business Rule Parameters in Priority Setting of Wafer Processing," filed on Feb. 2, 2000, with Ser. No. 09/496,205 which is herein incorporated by reference.

Figure 2B:
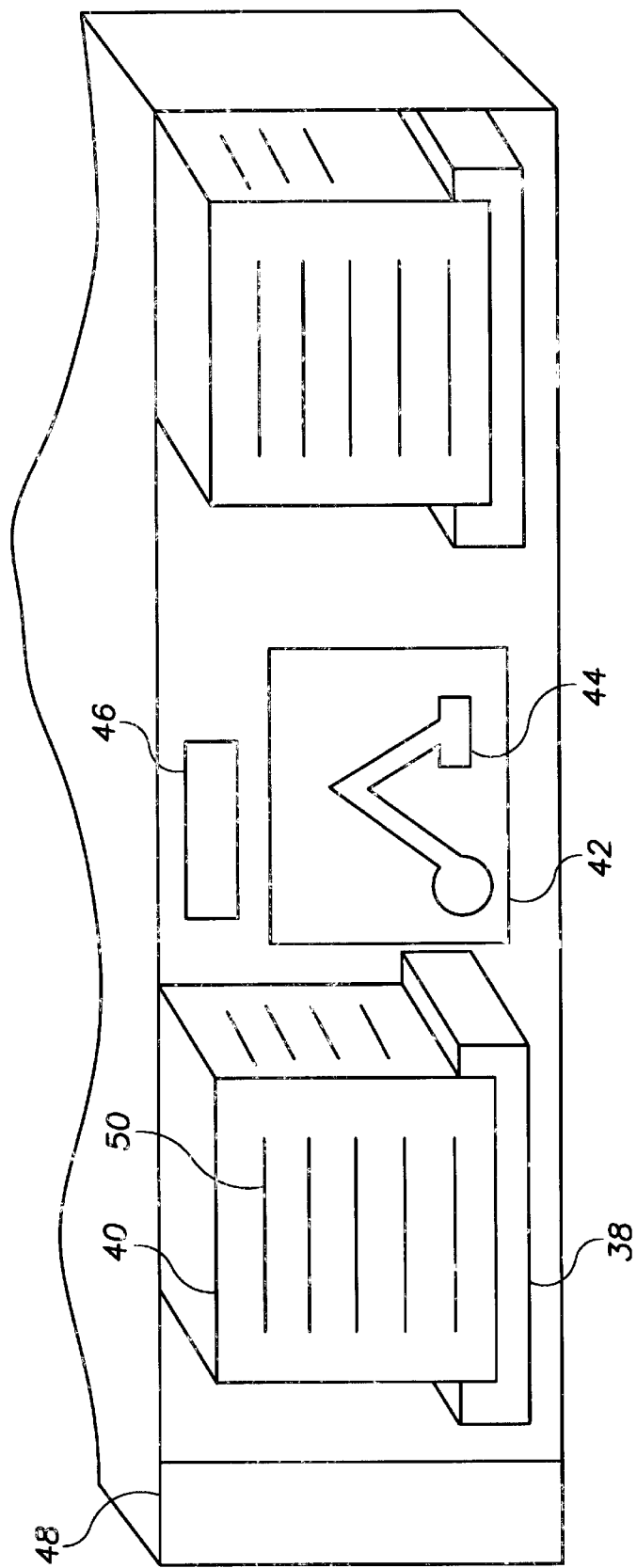
FIG. 2B illustrates a front view of the integrated stocker/sorter apparatus in accordance with an embodiment of the invention.

Referring to FIGS. 2A–2B, a top view of apparatus 32 illustrates that the apparatus is composed of an enclosure 34, with doors 36, that has various storage bins 38 therein. Storage bins 38 hold various wafer carriers 40, the carriers usually have cassettes that carry the wafers. Apparatus 32 includes a robotic arm mechanism 44 for sorting wafers and carriers within the enclosure. A scanning device, represented by box 46, is located within enclosure 34 and is used for scanning wafers and wafer carriers. Scanning device 46 is also adapted to identify/read codes located on wafer carriers 40 that indicate the position of a wafer within the carrier and by slot. A computer arrangement 48, that is coupled to scanning device 46 and to arm mechanism 44, is adapted to control the scanning device and the arm mechanism and to store data retrieved from the scanning device and the robotic arm.

FIG. 2B illustrates a front view of apparatus 32 with carriers on either side of the sorting mechanism. In another example embodiment, the carriers can be on one side of the enclosure with the sorter mechanism on the other side with a barrier disposed within the enclosure that provides a separation between the stored wafers and the wafers being sorted. The barrier can be made to provide the capability of decoupling the stocking portion from the sorting portion of apparatus 32. A filtering and airflow system can be coupled to the enclosure to provide for a clean environment inside the enclosure. Apparatus 32 can also include a vibration control system coupled to the enclosure that is adapted for substantially reducing vibration within the enclosure and preventing damage to the wafers inside.

Figure 3:
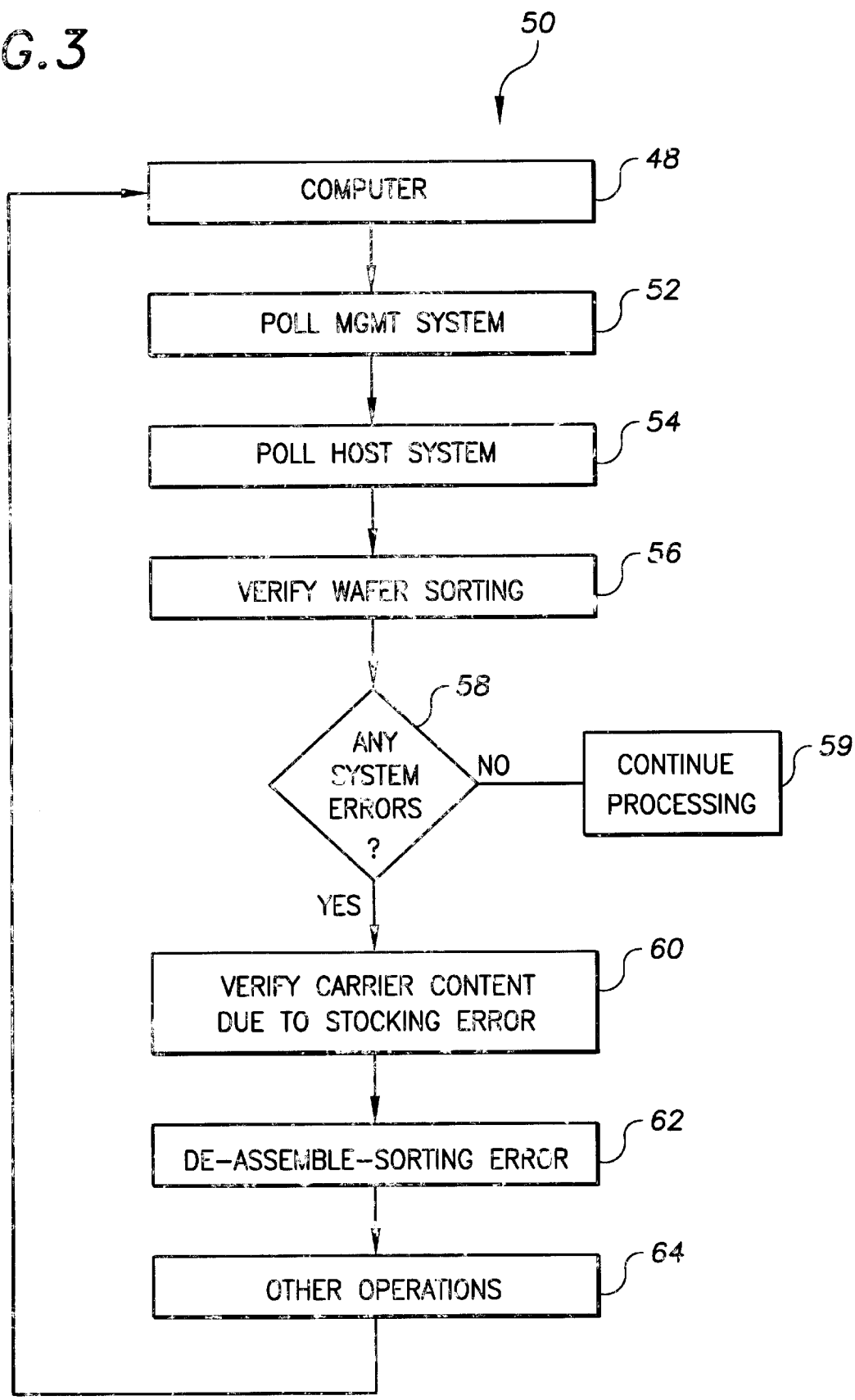
FIG. 3 is a flow diagram of computer arrangement of the stocker/sorter apparatus polling the management and host systems in accordance with an embodiment of the invention.

Referring to FIG. 3, a flow diagram 50 provides an example of how the system and apparatus can be enhanced by having the computer arrangement tied to the manufacturing facility system and the management system to provide for programming options or changes in the manufacturing process during wafer processing. Computer arrangement 48 polls the management system at 52 to determine if any management directives have been issued that might change the stocking/sorting status of the wafers.

The host system is also polled at 54 for event changes on the line that can also affect the wafer mix, etc. At 56 the computer arrangement will periodically verify that the wafers are sorted and will initiate a sorting function when the wafers are not sorted. At 58 the host system is checked for any errors that may have occurred on the processing line. If there are no errors, processing continues at 59. The computer arrangement signals the scanner and sorter to conduct an automatic content verification at 60 of the carriers disposed within the apparatus when a stocking error occurs. At 62, a de-assemble operation for a sorting error will be initiated. The de-assemble operation includes de-assembling wafer movement back to the original components and moving the carrier out of the apparatus for external inspection. The scanner in combination with the sorter 64 can also identify/read, rotate and inspect wafers. The system can also compress wafer lots and test lots.

As noted above, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. An apparatus for storing and sorting wafers for use in a wafer processing system, the apparatus comprising:
   means for scanning wafers and wafer carriers, scanning means adapted to identify codes located on the wafer carriers that indicate the position of a wafer within the carrier and by slot;
   means for sorting wafers and carriers within storage bins located in an enclosure; and
   a computer arrangement controlling scanning means and sorting means and storing data retrieved therefrom, the data being used for wafer selection and for tracking wafer movement from the start of processing.

2. The apparatus of claim 1, wherein the computer arrangement is coupled to a host system of the wafer processing system.

3. The apparatus of claim 2, wherein the computer arrangement will periodically verify that the wafers are sorted and will initiate a sorting function when the wafers are not sorted.

4. The apparatus of claim 1, wherein scanning means in combination with sorting means is adapted to identify, rotate and inspect wafers.

5. The apparatus of claim 1, wherein the apparatus can manipulate multiple carriers in order to do a multiple carrier merge, split, extractions and combinations.

6. The apparatus of claim 2, wherein the computer arrangement and sorting means have recipe functionality, that include externally guided recipes and on demand internal recipes, that is combinable with other system functions that include balancing of cassette types, cassette cleaning and empty cassette integration.

7. The apparatus of claim 1, further including a barrier disposed within the enclosure that provides a separation between the stored wafers and the wafers being sorted.

8. The apparatus of claim 7, further including a filtering and air flow system coupled to the enclosure.

9. The apparatus of claim 1, further including a vibration control system coupled to the enclosure that is adapted for substantially reducing vibration within the enclosure.

10. The apparatus of claim 1, wherein the computer arrangement signals scanning means and sorting means to conduct an automatic content verification of the carriers disposed within the apparatus.

11. The apparatus of claim 1, wherein the computer arrangement signals scanning means and sorting means to conduct a wafer de-assemble operation when a sorting error occurs.

12. The apparatus of claim 1, wherein the computer arrangement signals scanning means and sorting means to conduct verification operations that include wafer presence, single and limited wafer identification, wafer slot count per location, cassette identification, randomly pulling and verifying cassette and dimensional aspects of wafers and carriers.

13. The apparatus of claim 1 further including a management system coupled to the computer arrangement, the management system adapted to communicate with a stocking portion of the apparatus.

14. The apparatus of claim 1, wherein the apparatus is composed of a stocking portion and a sorting portion that can be decoupled to operate independently of the other portion.

15. A system for storing and sorting wafers in a wafer processing system, comprising:
   a plurality of stocking locations for wafers and cassettes;
   a plurality of carriers having wafers and cassettes disposed therein;
   an apparatus for stocking and sorting wafers adapted to track wafer movement from the start of processing and to select wafers as a function of an externally provided directive; and
   a conveyor arrangement for moving wafers from one of the stocking locations to a processing location.

16. The system of claim 15, wherein the stocking and sorting apparatus includes means for scanning wafers and wafer carriers by identifying codes located on the wafer carriers that indicate the position of a wafer within the carrier and by slot; means for sorting the wafers and carriers within storage bins located in an enclosure; and a computer arrangement controlling scanning and sorting and storing data retrieved therefrom, the data being used for wafer selection and for tracking wafer movement from the start of processing.

17. The system of claim 16, further including a management system coupled to the computer arrangement and the stocking locations, the management system adapted to communicate a directive that includes a wafer processing sequence change.

18. The system of claim 15, wherein the apparatus is composed of a stocking portion and a sorting portion that can be decoupled to operate independently of the other portion.

19. An apparatus for storing and sorting wafers for use in a wafer processing system, the apparatus comprising:

a scanning device for scanning wafers and wafer carriers, the scanning device adapted to identify codes located on the wafer carriers that indicate the position of a wafer within the carrier and by slot;

a robotic arm mechanism for sorting wafers and carriers within storage bins located in an enclosure; and a computer arrangement controlling scanning and sorting and storing data retrieved therefrom, the data being used for wafer selection and for tracking wafer movement from the start of processing.

20. An method for storing and sorting wafers for use in a wafer processing system, the method comprising:

scanning wafers and wafer carriers by identifying codes located on the wafer carriers that indicate the position of a wafer within the carrier and by slot;

sorting the wafers and carriers within storage bins located in an enclosure; and using a computer arrangement for controlling the scanning and sorting and storing data retrieved therefrom, the data being used for wafer selection and for tracking wafer movement from the start of processing.

21. The method of claim 20, further including the step of storing the wafers within a portion of the enclosure.

22. The method of claim 21, further including the steps of selecting a wafer as a function of an externally provided directive and communicating the selection to the computer arrangement.

23. The method of claim 21, further including the step of verifying carrier content as function of an externally provided directive.

24. The method of claim 21, further including the step of providing a wafer recipe for selective sorting of wafers as a function of an externally provide directive.

25. The method of claim 21, further including the steps of filtering the air and reducing vibration within the enclosure.

* * * * *

UNITED STATES PATENT AND TRADEMARK OFFICE
CERTIFICATE OF CORRECTION

PATENT NO. : 6,392,403 B1
DATED : May 21, 2002
INVENTOR(S) : Conboy et al.

It is certified that error appears in the above-identified patent and that said Letters Patent is hereby corrected as shown below:

Column 4,
Lines 54-55, please delete "with Ser. No. 09/496,205".

Column 7,
Line 28, please replace "An" with -- A --.

Signed and Sealed this

Eighth Day of October, 2002

*Attest:*

*Attesting Officer*

JAMES E. ROGAN
*Director of the United States Patent and Trademark Office*